United States Patent
Machida et al.

(10) Patent No.: US 7,402,226 B2
(45) Date of Patent: Jul. 22, 2008

(54) MINUTE HIGH-PERFORMANCE RARE EARTH MAGNET FOR MICROMINI PRODUCT AND PROCESS FOR PRODUCING THE SAME

(75) Inventors: Kenichi Machida, Room 401, Green Hill Higashiminoh 5-tou, 4, Aomatani-nishi 1-chome, Minoh-shi, Osaka 562-0023 (JP); Shunji Suzuki, Shizuoka (JP); Eiji Sakaguchi, Kyoto (JP); Naoyuki Ishigaki, Shiga (JP)

(73) Assignees: Japan Science and Technology Agency, Kawaguchi-shi (JP); Hitachi Metals, Ltd., Tokyo (JP); Kenichi Machida, Minoh-shi (JP)

( * ) Notice: Subject to any disclaimer, the term of this patent is extended or adjusted under 35 U.S.C. 154(b) by 0 days.

(21) Appl. No.: 10/551,432

(22) PCT Filed: Mar. 4, 2004

(86) PCT No.: PCT/JP2004/002738

§ 371 (c)(1),
(2), (4) Date: Sep. 29, 2005

(87) PCT Pub. No.: WO2004/088683

PCT Pub. Date: Oct. 14, 2004

(65) Prior Publication Data

US 2006/0278517 A1 Dec. 14, 2006

(30) Foreign Application Priority Data

Mar. 31, 2003 (JP) ............................. 2003-096866

(51) Int. Cl.
*C23C 14/34* (2006.01)
(52) U.S. Cl. ................................................. 204/192.2
(58) Field of Classification Search ............. 204/298.28, 204/192.2, 192.1
See application file for complete search history.

(56) References Cited

U.S. PATENT DOCUMENTS

| 4,784,739 | A  | * | 11/1988 | Kadokura et al. ........ 204/192.2 |
| 6,837,975 | B2 | * | 1/2005  | Wang et al. ............ 204/298.22 |
| 6,861,089 | B2 | * | 3/2005  | Nishiuchi et al. ........... 427/127 |

FOREIGN PATENT DOCUMENTS

| JP | 61-170565 |   | 8/1986  |
| JP | 62-74048  |   | 4/1987  |
| JP | 62-074048 | * | 4/1987  |
| JP | 63-176473 | A | 7/1988  |
| JP | 63-303063 | A | 12/1988 |

(Continued)

*Primary Examiner*—Timothy Meeks
*Assistant Examiner*—Elizabeth A Burkhart
(74) *Attorney, Agent, or Firm*—Westerman, Hattori, Daniels & Adrian, LLP.

(57) ABSTRACT

A method of manufacturing a rare earth permanent magnet comprises the steps of: forming a rare earth magnet by applying mechanical processing to a magnet block material, thereby damaging the surface of the magnet and causing a magnetic characteristic $(BH)_{max}$ of the magnet to deteriorate, followed by transforming a rare earth metal or an alloy thereof into fine particles or a vapor, and allowing the fine particles or vapor to diffuse and permeate the magnet, thereby improving the quality of the damaged magnet surface portion so that the magnetic characteristic $(BH)_{max}$ is recovered.

4 Claims, 2 Drawing Sheets

FOREIGN PATENT DOCUMENTS

| | | | |
|---|---|---|---|
| JP | 01-117303 | * | 5/1989 |
| JP | 1-117303 | | 5/1989 |
| JP | 2-98850 A | | 4/1990 |
| JP | 5-190311 A | | 7/1993 |
| JP | 9-270310 | | 10/1997 |
| JP | 10-270278 A | | 10/1998 |
| JP | 2000-12366 A | | 1/2000 |
| JP | 2000-319778 | * | 11/2000 |
| JP | 2001-49428 A | | 2/2001 |
| JP | 2001-93715 | | 4/2001 |
| JP | 2001-135511 | * | 5/2001 |
| JP | 2002-60928 | | 2/2002 |

* cited by examiner (a) a reflected electron image   (b) a Dy element image

MINUTE HIGH-PERFORMANCE RARE EARTH MAGNET FOR MICROMINI PRODUCT AND PROCESS FOR PRODUCING THE SAME

CROSS-REFERENCE TO RELATED APPLICATIONS

This application is a 35 U.S.C. 371 national stage filing of International Application No. PCT/JP2004/002738, filed on Mar. 4, 2004, which claims priority to Japanese Patent Application No. 2003-096866, filed on March 31, 2003 in Japan.

TECHNICAL FIELD OF THE INVENTION

The present invention relates to a rare earth permanent magnet such as an Nd—Fe—B system or Pr—Fe—B system, in particular, a small and high performance rare earth permanent magnet for micro applications such as micro motors and so on, and a method of manufacturing the same.

BACKGROUND OF THE INVENTION

An Nd—Fe—B rare earth sintered magnet is known as the permanent magnet with the best performance, widely used in voice coil motors (VCMs) of hard disc drives, magnetic circuits for magnetic resonance imaging devices (MRIs) and so on. Furthermore, it is known that in the magnet, the internal structure has a microstructure in which a periphery of an $Nd_2Fe_{14}B$ primary phase is surrounded by a thin Nd-rich sub-phase, and thereby a coercive field is generated and a high magnetic energy product is exhibited.

On the other hand, in the case of a sintered magnet being used in an actual motor or the like, in actuality, grinding is applied to obtain the final dimension and concentricity. However, in this case, owing to such phenomena as minute grinding cracks or oxidation, the Nd-rich phase of the magnet surface layer is damaged, and as a result, the magnetic properties of the magnet surface portion deteriorate to a small fraction of that within the magnet.

This phenomenon is pronounced particularly in a small magnet where a ratio of surface area to volume is large; for instance, in the case of a block magnet of a 10 mm cube with the $(BH)_{max}$ of $360 kJ/m^3$, when cut and ground to $1\times1\times2$ mm, the $(BH)_{max}$ deteriorates to about $240 kJ/m^3$; that is, the magnetic properties intrinsic to the Nd—Fe—B rare earth permanent magnet cannot be obtained.

In order to improve such defects of the Nd—Fe—B sintered magnet, there is a proposal in which a layer denatured by mechanical working is removed by means of mechanical polishing and chemical polishing (for instance, patent document 1). Also, another method is proposed in which the magnet surface is ground and then covered by a rare earth metal, followed by diffusion heat treatment (for instance, patent document 2). Also, there is a method in which a SmCo film is formed on the surface of an Nd—Fe—B magnet (for instance, patent document 3).

Patent document 1: JP-A-09-270310
Patent document 2: JP-A-62-74048 (JP-B-06-63086)
Patent document 3: JP-A-2001-93715

DISCLOSURE OF THE INVENTION

In the method described in the patent document 1, there are the problems that since the denatured layer is assumed to extend 10 µm deep or more, the polishing takes a long time; rapid polishing generates a denatured layer a new; and furthermore, when the chemical polishing is applied, an acid solution remains in pores of the sintered magnet and tends to generate corrosion marks.

The patent document 2 discloses that a thin rare earth metal layer is formed on a layer that has been denatured, by grinding the surface of the sintered magnet body and then causing a diffusion reaction, there by forming a modified layer. However, specifically, it describes only an experimental result in which on a thin test piece having a length of 20 mm and a width of 5 mm and a thickness of 1.5 mm, a sputtering film is formed; moreover, the obtained $(BH)_{max}$ is at most 200 $kJ/cm^3$.

Furthermore, according to the method described in the patent document 3, since the deposition alone does not cause a metallic reaction to the $Nd_2Fe_{14}B$ phase and the Nd-rich phase, it is difficult to recover the magnetic properties. Still furthermore, when Sm is diffused inside of the magnet by the heat treatment, since the crystal magnetic anisotropy of the $Nd_2Fe_{14}B$ phase is deteriorated, and it is difficult to recover the magnetic properties. Furthermore, during the deposition, a test piece is turned upside down and sputtered again, causing difficulties with the productivity of the deposition and the uniformity of the film thickness.

Recently, for instance, for vibration motors for cellular phones, a lot of cylindrical Nd—Fe—B sintered magnets having an external diameter of substantially 2 mm are used. However, actually measured magnetic property of those magnets exhibits maximum energy product of an about 230 $kJ/m^3$, and so it is difficult to realize a smaller size without lowering the vibration intensity. Applications to high output power and small size actuators that will be required in future for micro robots and micro motors for in vivo diagnosis are all the more difficult.

The present invention intends to solve such problems of conventional technologies as mentioned above, and to obtain a high performance rare earth permanent magnet, in particular, a small volume rare earth permanent magnet and means effective in manufacturing micro motors therewith.

The present inventors, after earnest study of the deterioration of the magnetic properties due to the processing damage caused when a small magnet is manufactured by applying mechanical working such as cutting, drilling, grinding and polishing on a sintered magnet block and repeating counter-measure experiments, succeeded in developing a small and high performance rare earth permanent magnet whose original magnetic properties are restored and can be used for micro applications.

That is, the invention is (1) a method of manufacturing a small and high performance rare earth permanent magnet for micro applications the method being characterized in that a cylindrical or disc-like rare earth magnet with a hole forming an inner surface, that is formed by applying mechanical processing such as cutting, drilling, and surface grinding or polishing to a magnet block material, the magnet has a surface to volume ratio of $2 mm^{-1}$ or more, a volume of $100 mm^3$ or less and has a damaged and denatured surface is supported in a depressurized tank by inserting an electrode wire into the hole of the magnet, the electrode wire is extended to the plasma space in the middle of the oppositely disposed targets, and an R metal (here, R denotes one kind or two or more kinds of rare earth elements selected from the group consisting of Y, Nd, Dy, Pr, Ho and Tb) or an alloy containing an R metal is transformed into fine particles by a sputtering method with the magnet rotating with the electrode wire as a rotation shaft, and is three-dimensionally blown onto the whole or part of the surface of the magnet and deposited there, the R metal is allowed to diffuse and permeate from the surface of the magnet to the inside of the magnet at a depth corresponding to a radius of a grain exposed on the outermost surface of the magnet or more, and thereby the quality of the magnet surface portion damaged and denatured by the mechanical processing is improved so that the magnetic characteristic $(BH)_{max}$ deteriorated due to damage and denature is recovered to 280 kJ/m³ or more.

Still furthermore, the invention is (2) a method of manufacturing a small and high performance rare earth permanent magnet set forth in (1) characterized in that the diffusion and permeation are carried out as deposition is carried out.

Still furthermore, the invention is (3) a method of manufacturing a small and high performance rare earth permanent magnet set forth in (1) characterized in that the oppositely-disposed targets are ring-like targets disposed concentrically around the center axis of the cylindrical or disc-like magnet.

Still furthermore, the invention is (4) a method of manufacturing a small and high performance rare earth permanent magnet for micro applications characterized in that a cylindrical or disc-like rare earth magnet with a hole forming an inner surface or a cylindrical or prismatic rare earth magnet with no hole, that is formed by applying mechanical processing such as cutting, drilling, and surface grinding or polishing to a magnet block material, the magnet has a surface to volume ratio of 2 mm⁻¹ or more, a volume of 100 mm³ or less and has a damaged and denatured surface is supported in a depressurized tank by packing in a wire mesh basket so as to be freely tumbled, and an R metal (here, R denotes one kind or two or more kinds of rare earth elements selected from the group consisting of Y, Nd, Dy, Pr, Ho and Tb) or an alloy containing an R metal is vaporized in the depressurized tank by physical means and is three-dimensionally blown onto the whole or part of the surface of the magnet and deposited there, the R metal is allowed to diffuse and permeate from the surface of the magnet to the inside of the magnet at a depth corresponding to a radius of a grain exposed on the outermost surface of the magnet or more, and thereby the quality of the magnet surface portion damaged and denatured by the mechanical processing is improved so that the magnetic characteristic $(BH)_{max}$ deteriorated due to damage and denature is recovered to 280 kJ/m3 or more Still furthermore, the invention is (5) a method of manufacturing a small and high performance rare earth permanent magnet as set forth in claim 9 characterized in that the diffusion and permeation are carried out as deposition is carried out.

Still furthermore, the invention is (6) a method of manufacturing a small and high-performance rare earth permanent magnet as set forth in claim 3 or 9 characterized in that the concentration of the impurity gases from the air contained in the ambient atmosphere when the R metal is heated for diffusion is reduced to 50 ppm or less.

Still furthermore, the invention is (7) a method of manufacturing a small and high-performance rare earth permanent magnet as set forth in claim 3 or 9 characterized in that the magnet is an Nd—Fe—B system or Pr—Fe—B system magnet and the R metal is Dy or Tb.

OPERATION

When a magnet block is mechanically processed by cutting, drilling, grinding, polishing and so on, the magnet surface is damaged and denatured, resulting in deterioration of the magnetic properties. When, on a surface of the magnet having the damaged and denatured surface, one or more kinds of rare earth elements selected from the group consisting of Dy, Pr, Ho, Tb, Y, and Nd are used in pure element form, or in alloys containing equivalent amounts of the metals is deposited and allowed to diffuse to the inside of the magnet. In the case for instance of a Nd—Fe—B rare earth magnet, since these rare earth metals are the same type as the Nd in the $Nd_2Fe_{14}B$ primary phase and a Nd-rich grain boundary phase, these are excellent with regard to affinity with Nd and mainly react with the Nd-rich phase, and thereby a portion damaged and denatured by the mechanical working can be easily repaired and the magnetic properties can be restored.

Furthermore, in the case of these rare earth metals partially diffusing into the $Nd_2Fe_{14}B$ primary phase and replacing the Nd element, all of the rare earth metals work so as to increase the crystal magnetic anisotropy of the primary phase to increase the coercive force, and thereby the magnetic properties can be restored. In particular, since the crystal magnetic anisotropy at room temperature of $Tb_2Fe_{14}B$ that is obtained by replacing the entire Nd element in the primary phase with Tb is substantially three times that of $Nd_2Fe_{14}B$, large coercive force can be easily obtained. Also, with the Pr—Fe—B magnet similar restoring function can be obtained.

The depth to which the rare earth metal permeates owing to the diffusion process is set to correspond to the radius of a grain exposed on the outermost surface of the magnet, or more. The grain diameter of, for instance, a Nd—Fe—B sintered magnet is in the general range from 6 to 10 μm; accordingly, 3 μm corresponding to the radius of the grain exposed on the outermost surface of the magnet or more is at the minimum necessary. When the depth is less than this, the reaction with the Nd-rich phase that surrounds a crystal grain becomes insufficient, and the magnetic properties can be only slightly restored. When the depth becomes 3 μm or more, the coercive force gradually increases, the Nd in the $Nd_2Fe_{14}B$ primary phase is replaced, and the coercive force is further increased. However, when the diffusion proceeds to an excessive depth, the residual magnetization is in some cases lowered; accordingly, it is desirable to obtain desired magnetic properties by adjusting the conditions of the diffusion process.

In the invention, the restoration of the magnetic properties due to the surface improvement does not depend on a size of the rare earth magnet; however, the smaller the volume of the magnet is or the larger the surface to volume ratio of the magnet is, the more remarkable the restoration effect is. According to the past research on the size of the Nd—Fe—B sintered magnet and the magnetic properties thereof done by the present inventors, it was made clear that when the magnet is a block of a cube 2 mm on a side or smaller, the rectangularity of the demagnetization curve becomes poor, resulting in a decrease in the coercive force.

In this size, it is easily calculated that the magnet volume is 8 mm³ and a surface to volume ratio is 3 mm⁻¹. Furthermore, in the case of the cylindrical magnet, since the surface to volume ratio increases further, the deterioration of the rectangularity and the coercive force becomes remarkable. For example, an outer diameter, an inner diameter and a length of a magnet mounted on a vibration motor for a cellular phone are substantially 2.5 mm, 1 mm and 4 mm, respectively, and the volume is substantially 16.5 mm³.

Accordingly, in a small magnet in which the surface to volume ratio is 2 mm⁻¹ or more, more preferably 3 mm⁻¹ or more, and the volume is substantially 100 mm³ or less, and furthermore 20 mm³ or less, the effect of the surface improvement is particularly remarkable. Specifically, in comparison with the $(BH)_{max}$ of the Nd—Fe—B magnet mounted on a commercially available vibration motor which is an approximately 240 kJ/m$^3$, in the invention, high level value of an 80 kJ/m$^3$ or more, for instance, from a 300 to 360 kJ/m$^3$ can be obtained.

EFFECTS OF THE INVENTION

According to the methods of the present invention, by depositing and diffusing a rare earth metal on a magnet surface damaged and denatured by mechanical working, a phase rich in the rare earth metal such as Nd on a surface of the damaged and denatured magnet can be improved, and thereby the magnetic properties can be sufficiently restored. Furthermore, as a result thereof, a small and high output power motor with a small and high performance magnet can be realized.

Figure 1:
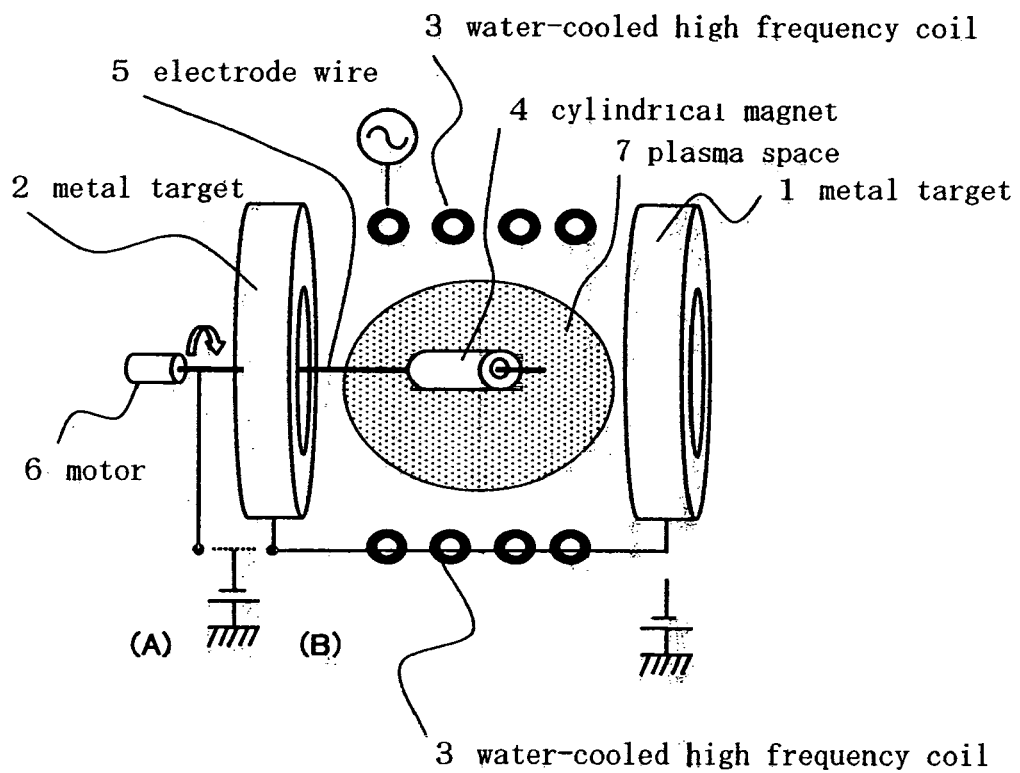
FIG. 1 is a schematic diagram of the surroundings of a target of three-dimensional sputtering apparatus that can be preferably used in a method according to the present invention.

DESCRIPTION OF REFERENCE NUMERALS AND SIGNS 1, 2: metal target
3: water-cooled high frequency coil
4: cylindrical magnet
5: electrode wire
6: motor
7: plasma space

BEST MODE FOR CARRYING OUT THE INVENTION

In what follows, a method according to the invention of manufacturing a small and high performance rare earth permanent magnet will be detailed in accordance with manufacturing steps.

A block material of rare earth magnet that is used in the method according to the invention is one that is manufactured by sintering raw material powder or by hot-pressing raw material powder followed by hot plastic working. The block material of the rare earth magnet is mechanically processed by cutting, drilling, grinding, polishing and so on, and there by a cylindrical or disc-like small magnet with a hole forming an inner surface, or a cylindrical or prismatic small magnet with no hole is manufactured. Thereby, a small magnet having surface to volume ratio 2 mm$^{-1}$ or more and volume 100 mm$^3$ or less is manufactured. Preferable alloy systems for small magnets include the typical Nd—Fe—B system and Pr—Fe—B system. Among these, the Nd—Fe—B system sintered magnet, while having the best magnetic properties, exhibits the most deterioration of these properties by mechanical working.

A metal that is deposited on a magnet surface having a damaged and denatured surface in order to remedy and reinforce a phase rich in the rare earth metal such as Nd and so on that constitutes the magnet, one or more rare earth metals selected from the group consisting of Dy, Pr, Ho, Tb, Y, and Nd are used in pure element form, or in an alloy that contains equivalent amounts of rare earth metals such as Y, Nd, Dy, Pr, Ho, Tb such as a Nd—Fe alloy and a Dy—Co alloy is used.

The method of depositing a film on a magnet surface is not particularly restricted, and physical deposition methods such as vapor deposition, sputtering, ion plating, laser deposition, chemical vapor phase deposited methods such as CVD, MO-CVD, and the plating method can be applied. The respective processes of the deposition and the diffusion due to heating are desirably performed in a clean ambient atmosphere with pressure 10$^{-7}$ Torr or less and with the concentration of gases from the air such as oxygen and water vapor on the order of tens of ppm or less.

In the case where the R metal is caused by heating to diffuse and permeate from the magnet surface and the ambient atmosphere has purity equivalent to ordinarily available high purity argon gas, owing to gases from the air contained in the argon gas, that is, oxygen, water vapor, carbon dioxide, nitrogen and so on, the R metal deposited on a surface becomes an oxide, a carbide and a nitride during heating of the magnet, and thereby in some cases the R metal cannot efficiently diffuse to the internal structural phase. Accordingly, the concentration of the impurity gases from the air contained in the ambient atmosphere when the R metal is heated for diffusion is desirably reduced to 50 ppm or less, and still more desirably to 10 ppm or less.

In order to form an extremely uniform film on the entire surface or part of a surface of a small magnet that has a shape such as a cylinder, disc and so on, a sputtering method in which a metal component is three-dimensionally deposited on a magnet surface from a plurality of targets, or an ion plating method in which a metal component is ionized and deposited by taking advantage of strong electrostatic attraction for coating is particularly effective.

Furthermore, the method of holding a rare earth magnet in a plasma space during the sputtering may be one in which one or a plurality of magnets is held so as to be freely rotated with a wire or plate or one in which a plurality of magnets is packed in a wire mesh basket and held so as to be freely tumbled. By use of such holding methods, a uniform film can be three-dimensionally formed on the entire surface of a small magnet.

The above-mentioned rare earth metals for deposition do not restore magnetic properties simply by covering the magnet surface. That is, it is necessary that at least part of the deposited rare earth metal component diffuses within the magnet and reacts with the phase rich in a rare earth metal such as Nd. Accordingly, it is usual to heat the magnet, after the deposition, at a temperature from 500 to 1000 degree centigrade for a short time to diffuse the deposited metal. In the case of sputtering, when the deposition is carried out with the radio frequency (RF) and DC power raised during the sputtering, the magnet can be heated during deposition to the above temperature range, for instance, to about 800 degree centigrade; accordingly, in effect, the deposition and diffusion can be simultaneously carried out.

FIG. 1 shows a conception of three-dimensional sputtering apparatus preferable for implementing a manufacturing method according to the invention. In FIG. 1, ring-like targets 1 and 2 that are made of metal for deposition are disposed opposite each other and a water-cooled copper high frequency coil 3 is disposed between the both targets. In the inside of a cylindrical magnet 4, an electrode wire 5 is inserted, the electrode wire 5 being fixed to a rotation shaft of a motor 6 and held so as to be able to rotate the cylindrical magnet 4. In the case of a cylinder or prism with no hole, the method in which a plurality of magnet products is packed in a wire mesh basket and held so as to be freely tumbled can be adopted.

Here, in order to inhibit the inside of the cylindrical magnet 4 and the electrode wire 5 from sliding with regard to each other during the rotation, the electrode wire 5 is twisted into a small wavy shape and brought into contact with the inside of the cylinder. Since a small magnet weighs only a few tens of milligrams, the electrode wire 5 and the cylindrical magnet 4 hardly slide with regard to each other at all during the rotation.

Furthermore, the apparatus is equipped with a mechanism in which owing to a cathode exchanging switch (A), reverse sputtering of the cylindrical magnet 4 is enabled. During the reverse sputtering, the magnet 4 is made to be electrically negative through the electrode wire 5, and thereby the surface of the magnet 4 is etched. During the ordinary sputtering, the switch is turned to (B). During ordinary sputtering, it is usual to deposit a film by sputtering without applying electric potential to the electrode wire 5. However, depending on the kinds of depositing metals and in order to control the film quality, in some cases, a positive bias potential is given to the magnet 4 through the electrode wire 5 to perform the sputtering deposition. During the ordinary sputtering, a plasma space 7 in which metal particles and metal ions generated from the targets 1 and 2 and Ar ions are intermingled is formed, and metal particles come flying three-dimensionally from up-and-down, right-and-left and fore-and-aft onto the surface of the cylindrical magnet 4 and are deposited there.

In the case where deposit is applied to the magnet according to such a method and the deposition is not done as the diffusion is carried out, after the inside of the sputtering apparatus is returned to atmospheric pressure, is transferred without coming into contact with air into a glove box connected to the sputtering apparatus and charged into a small electric furnace disposed in the glove box; and heat treatment is carried out to diffuse the film inside of the magnet.

In general, the rare earth metals are easily oxidized; accordingly, it is desirable to put into practical use after forming an anti-corrosive metal such as Ni or Al, or a water-repellant silane coating on the deposited magnet surface. Furthermore, in the case of the surface-modifying metal being Dy or Tb, since the oxidation in air proceeds very slowly in comparison with Nd, depending on the applications, the anti-corrosion film can be omitted.

EMBODIMENTS

In what follows, the present invention will be detailed according to embodiments.

Embodiment 1

From an alloy ingot having a composition of $Nd_{12.5}Fe_{78.5}Co_1B_8$, alloy foil having a thickness of from 0.2 to 0.3 mm was prepared according to the strip casting method. Next, the foil was packed in a vessel and allowed to absorb hydrogen gas at 500 kPa and at room temperature and the gas was released, thereby obtaining un even powder having a general size from 0.15 to 0.2 mm. Then, the uneven powder was subjected to jet mill pulverization, and thereby fine powder of approximately 3 μm particle size was prepared.

The fine powder was admixed with 0.05% by weight of calcium stearate, press-molded in a magnetic field, charged into a vacuum furnace and sintered at 1080 degree centigrade for 1 hr, and thereby a cubic magnet block material with sides of length 18 mm was obtained.

Subsequently, to the cubic magnet block material, grind stone cutting, outer periphery grinding and ultrasonic drilling were applied and thereby a cylindrical magnet having an outer diameter of 1 mm, an inner diameter of 0.3 mm and a length of 3 mm was prepared. One of these was made a sample of comparative example (1). Volume thereof is 2.14 $mm^3$, surface area is 13.67 $mm^2$ and surface to volume ratio is 6.4 $mm^{-1}$.

Next, by use of the three-dimensional sputtering apparatus shown in FIG. 1, a metal film was deposited on a surface of the cylindrical magnet. Dysprosium (Dy) metal was used as the target. Inside of the tube of the cylindrical magnet, as an electrode wire, a tungsten wire having a diameter of 0.2 mm was inserted. The size of the ring-like target used was 80 mm in outer diameter, 30 mm in inner diameter and 20 mm in thickness.

The actual deposition was carried out according to the following procedure. A tungsten wire was inserted and set inside of the tube of the cylindrical magnet, the inside of the sputtering apparatus was evacuated to $5 \times 10^{-5}$ Pa, and high purity Ar gas was introduced, and thereafter the inside of the apparatus was maintained at 3 Pa. Next, the cathode switch was turned to the (A) side, RF 20 W and DC 2 W were applied to carry out reverse sputtering for 10 min, and thereby an oxide film on a magnet surface was removed. Subsequently, the switch was turned to the (B) side, and RF 80 W and DC 120 W was applied to carry out the ordinary sputtering for 6 min.

The inside of the apparatus with the obtained deposited magnet was returned to an atmospheric pressure, the magnet was transferred into a glove box connected to the sputtering apparatus without coming into contact with air, it was charged into a small electric furnace disposed in the glove box, and heat treatment was applied first at a temperature of from 700 to 850 degree centigrade for 10 min and secondarily at a temperature of 600 degree centigrade for 30 min. These were inventive examples (1) through (4). In order to inhibit the magnet from being oxidized in the heat treatment, purified Ar gas was circulated inside the glove box, concentration of oxygen was maintained at 2 ppm or less and dew point was maintained at −75 degree centigrade or less.

Figure 2:
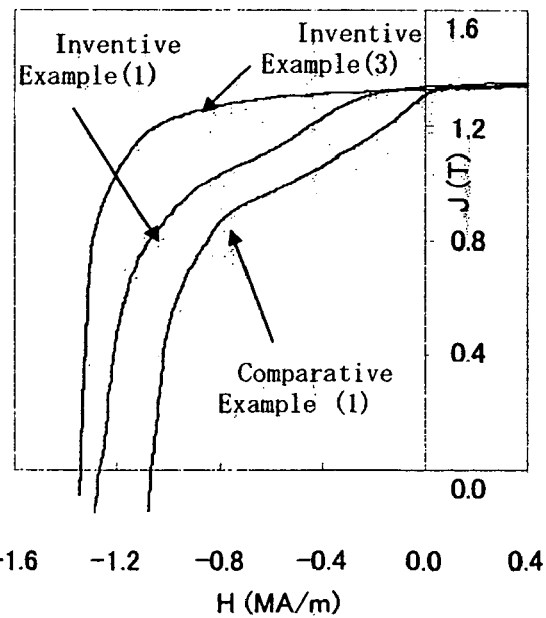
FIG. 2 is a graph showing the demagnetization curves of inventive examples (1) and (3) and comparative example (1).

The magnetic properties of the respective samples, after pulse magnetizing of 4.8 MA/m was applied, were measured by use of a vibration sample type magnetometer. In Table 1, the magnetic properties of the respective samples are shown, and in FIG. 2 extracted demagnetization curves of comparative example (1) and inventive examples (1) and (3) are shown.

As is clear from Table 1, owing to the Dy metal deposition and the subsequent heat treatment, all of the inventive examples were higher in the maximum energy product $BH_{max}$ than the comparative example. In particular, in the sample (3), the recovery of 38% was found in comparison with the comparative example (1). The reason for this apparently is that an Nd rich layer damaged by the mechanical working was repaired and reinforced. As a result, as is clear from the shapes of the demagnetization curves in FIG. 2, in comparison with untreated comparative example, the rectangularity (Hk/Hcj) of the surface modified inventive examples is remarkably improved. Here, the Hk denotes the magnetic field when on the demagnetization curve the value of the magnetization is 90% that of the residual magnetization.

TABLE 1

| Samples | | First step heat treatment (° C.) | (BH)max (kJ/m³) | Br (T) | Hcj (MA/m) | Hk/Hcj (%) |
|---|---|---|---|---|---|---|
| Comparative Example | (1) | — | 247 | 1.31 | 1.07 | 23 |
| Inventive Example | (1) | 700 | 283 | 1.33 | 1.27 | 54 |
| | (2) | 750 | 304 | 1.34 | 1.31 | 68 |
| | (3) | 800 | 341 | 1.35 | 1.34 | 76 |
| | (4) | 850 | 337 | 1.33 | 1.38 | 77 |

The Dy films of the samples were observed after the above measurement. Firstly, the inventive example (1) was buried in a resin, polished, lightly etched with nitric acid diluted with alcohol, and observed with an optical microscope at a magnification of 500 times. As a result, it was found that a coating of substantially 2 μm was uniformly formed on an entire surface of the outer periphery.

Figure 3:
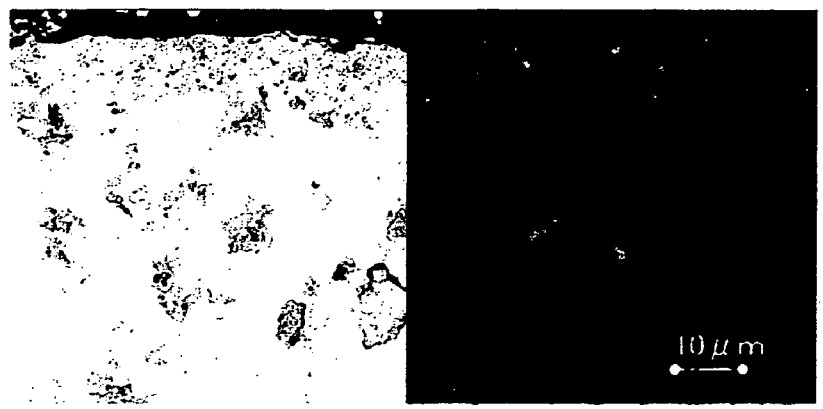
FIG. 3 is a microgram that substitutes for a drawing that shows a SEM image (a: a reflected electron image, b: a Dy element image) of inventive example (2) that is heat-treated after deposition of Dy.

Furthermore, the internal structure of the inventive example (2) was observed by use of an analyzing scanning electron microscope. As a result, as shown in the reflected electron image of FIG. 3A, the sample surface portion subjected to the Dy deposition and the subsequent heat treatment exhibited a structure different from that of the inside. In addition, in the Dy element image of FIG. 3B it is found that at the same time that there is a high concentration of Dy in a surface layer, the Dy element diffuses and permeates into the sample, and the diffusion depth is about 10 μm. The high Dy concentration portion seen in a center of the image is considered due to partial transfer of the image of a surface layer peeled during the polishing.

Embodiment 2

On the cylindrical magnets that were manufactured in embodiment 1 and have an outer diameter of 1 mm, an inner diameter of 0.3 mm and a length of 3 mm, metals of Nd, Dy, Pr, Tb and Al each were deposited, respectively. Here, target dimensions of Nd and Al were 80 mm in the outer diameter, 30 mm in the inner diameter and 20 mm in the thickness, the same as that of Dy in embodiment 1; on the other hand, Pr and Tb targets were prepared by applying and fixing the respective metals with a thickness of 2 mm on the surfaces that faced to the magnet of the Al target.

After the Nd metal target was attached to the three-dimensional sputtering apparatus, two of the cylindrical magnets were attached to a tungsten electrode wire followed by depositing the Nd metal. Similarly, other metals were deposited on the surface of the magnets. In the deposition, into the apparatus, Ar gas was introduced to maintain a pressure inside of the apparatus at 3 Pa, RF output power of 20 W and DC output power of 2 W were applied and the reverse sputtering was performed for 10 min; subsequently, RF output power of 100 W and DC output power of 200 W was applied and the sputtering was performed for 5 min.

The thickness of each of the metal films was obtained by burying one of two magnets in a resin followed by observing with a microscope. As a result, it was found that a thickness of Al film is 3.5 μm and that of rare earth metals is in the range of from 2.5 to 3 μm. On the other hand, the other magnets were charged into a small electric furnace in a glove box followed by subjecting to diffusion heat treatment at 800 degree centigrade for 10 min and at 600 degree centigrade for 30 min, and thereby the inventive examples (5) through (8) and comparative example (2) were prepared.

The comparative example (1) is the one from Table 1 and comparative example (3) is a sample in which Nd was deposited but heat treatment was not applied. The magnetic properties of the obtained magnet samples are shown in Table 2. As obvious from Table 2, in the case of the deposited metal being Al, the properties are almost the same as that of the comparative example (1) that does not have the metal film, that is, improvement of the surface is not found. Furthermore, in the comparative example (3), since the diffusion heat treatment was not applied, a diffusion layer was not formed; accordingly, restoration of the magnetic properties is not found. On the other hand, in all of the inventive examples, the coercive force Hcj and the maximum energy product $BH_{max}$ are largely restored.

TABLE 2

| Samples | | Deposited metal | (BH)max (kJ/m³) | Br (T) | Hcj (MA/m) | Hk/Hcj (%) |
|---|---|---|---|---|---|---|
| Comparative Example | (1) | — | 247 | 1.31 | 1.07 | 23 |
| | (2) | Al | 243 | 1.30 | 1.05 | 31 |
| | (3) | Nd | 249 | 1.29 | 1.09 | 25 |
| Inventive Example | (5) | Nd | 352 | 1.35 | 1.25 | 74 |
| | (6) | Dy | 358 | 1.33 | 1.43 | 77 |
| | (7) | Pr | 355 | 1.36 | 1.34 | 72 |
| | (8) | Tb | 366 | 1.34 | 1.58 | 81 |

Embodiment 3

A sintered magnet block having a composition of $Nd_{12}Dy_{2.5}Fe_{76.5}Co_1B_8$ was cut, ground and drilled, and thereby a disc-like magnet having an outer diameter of 10 mm, an inner diameter of 3 mm and a length of 1.4 mm was prepared. Volume is 100 mm³, surface area is 200 mm², and surface area to volume ratio is 2.0 mm⁻¹. On both surfaces thereof, a Tb film was deposited. The sputtering conditions were as follows. That is, by applying RF output of 40 W and DC output of 2 W, the reverse sputtering was performed for 10 min; thereafter by applying RF output of 150 W and by varying DC output from 100 to 800 W, magnets different in sputtering conditions were prepared.

The relationship between the DC output and the film thickness of the deposited Tb film was investigated. Based on the result of investigation, in order to obtain a thickness of a deposited Tb film of substantially 3 μm for all magnets, the sputtering time was set to be 20 min for 100 W and to be 5 min for 800 W. Furthermore, in the present embodiment, no diffusion heat treatment was done after the deposition, the temperature rise of the magnet sample during the deposition depended upon to cause the thermal diffusion of the Tb metal. The sample temperature during the deposition rose with increase in the DC output and, when the DC output was 600 W, redness of the sample due to heat was observed; accordingly, the temperature at this time was inferred to be about 700 degree centigrade. The respective samples were buried after the measurement of the magnetic properties, and the diffusion depth of the Tb metal in each sample was measured by use of an analysis scanning electron microscope, based on the distribution of the Tb element image on a surface of the magnet sample.

The magnetic properties of the obtained magnet samples are shown in Table 3. As is clear from Table 3, with an increase of the DC output, the sample was heated further, and in the inventive examples (9) through (13) in which the diffusion depth (t) was 3 μm or more, high energy product of 287 kJ/m³ (substantially 36 MGOe) or more was obtained. On the other hand, in comparative examples (4) through (6) that are inferred to be insufficiently heated, the diffusion of the Tb metal into the magnet is hardly detected at all; as a result, the energy product remains at a low value. Thus, when the sputtering conditions are appropriately selected, the diffusion of the Tb metal into the magnet can be performed simultaneously with the deposition, and thereby a subsequent heat treatment step can be omitted.

TABLE 3

| Samples | | DC Output (W) | t (µm) | (BH)max (kJ/m³) | Br (T) | Hcj (MA/m) |
|---|---|---|---|---|---|---|
| Comparative Example | (4) | 100 | 0 | 234 | 1.28 | 1.21 |
| | (5) | 200 | 0 | 237 | 1.27 | 1.22 |
| | (6) | 300 | 1 | 245 | 1.28 | 1.25 |
| Inventive Example | (9) | 400 | 3 | 287 | 1.30 | 1.48 |
| | (10) | 500 | 7 | 321 | 1.32 | 1.56 |
| | (11) | 600 | 10 | 330 | 1.33 | 1.63 |
| | (12) | 700 | 16 | 341 | 1.33 | 1.67 |
| | (13) | 800 | 35 | 335 | 1.32 | 1.68 |

Embodiment 4

From an alloy having a composition of $Nd_{12.5}Fe_{78.5}Co_1B_8$, according to steps the same as that of embodiment 1, disc-like sintered magnets having an outer diameter of 5.2 mm, an inner diameter of 1.9 mm and a thickness of 3 mm were manufactured. To these magnets, the outer diameter grinding and inner diameter grinding were applied followed by the surface grinding, and thereby disc-like magnets having an outer diameter of 5 mm, an inner diameter of 2 mm and thickness of 0.1 mm, 0.2 mm, 0.5 mm, 0.8 mm, 1.2 mm and 1.8 mm were obtained. The volumes and surface area to volume ratios respectively are in the ranges of from 2 to 30 $mm^3$ and from 21 to 2 $mm^{-1}$.

These magnets were penetrated and held by a stainless steel electrode wire and attached to an arc-discharge ion plating apparatus manufactured by Sinko Seiki K. K. The apparatus was evacuated to $1 \times 10^{-4}$ Pa, followed by introduction of high purity Ar gas, and thereafter the inside of the apparatus was maintained at 2 Pa. While rotating at 20 rpm with a voltage of −600 V applied to the stainless steel wire, Dy particles that were melted and vaporized by an electron gun and ionized by a thermal electron emission electrode and an ionization electrode were deposited on a magnet surface for 15 min, and thereby a magnet sample having a film thickness of 2 µm was prepared.

Subsequently, the samples were charged in an electric furnace in a glove box followed by applying diffusion heat treatment firstly at 850 degree centigrade for 10 min and secondarily at 550 degree centigrade for 60 min, and thereby the inventive examples (14) having a sample thickness of 0.1 mm through (19) having a sample thickness of 1.8 mm were prepared. The magnets after the grinding were made comparative examples (7) through (12) in order of thickness.

Figure 4:
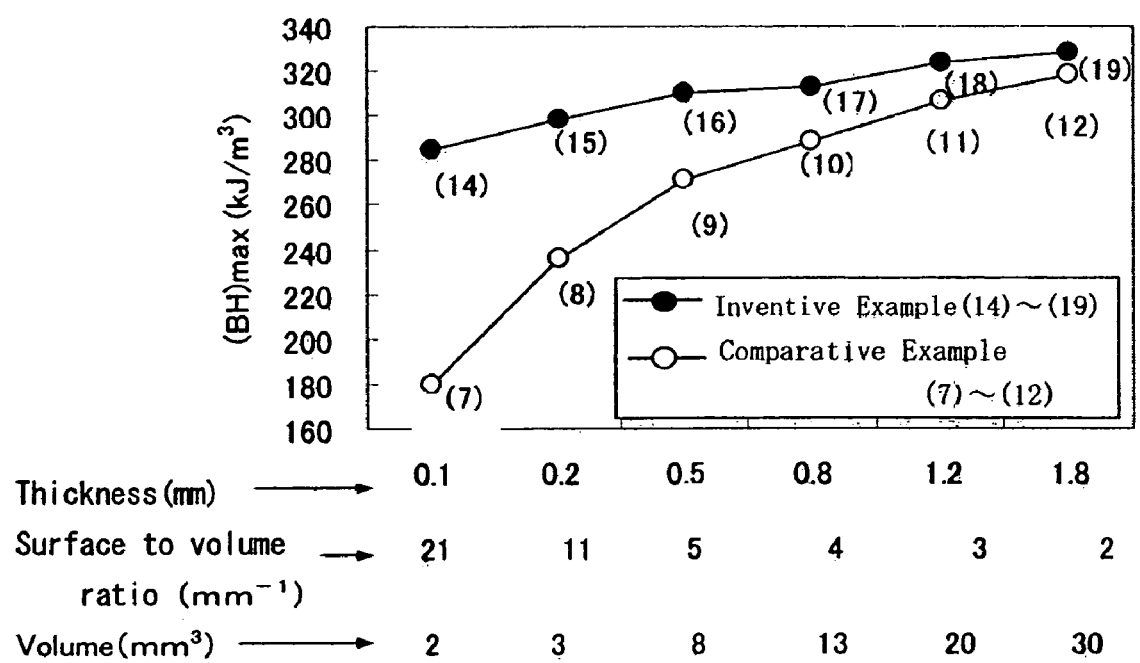
FIG. 4 is a diagram showing the relationship between dimensions of a magnet sample and the (BH)$_{max}$ in cases of the inventive and comparative magnet samples.

In FIG. 4, with thickness, surface area/volume ratio and volume of these samples as parameters, results of the magnetic property $(BH)_{max}$ are shown. From FIG. 4, the inventive examples (14) through (19) in which the Dy metal was deposited followed by diffusion heat treatment are found to be restored in the $(BH)_{max}$ in all dimensions, in contrast to untreated comparative examples (7) through (12). It was found that in the case of the volume of the magnet sample being 20 $mm^3$ or less and the surface area to volume ratio being 3 $mm^{-1}$ or more, and in particular in the case of the volume of the magnet sample being 10 $mm^3$ or less and the surface area to volume ratio being 5 $mm^{-1}$ or more, the restoration effect of the magnetic property due to the surface improvement was remarkable.

EFFECT OF THE INVENTION

According to the present invention, by depositing and diffusing a rare earth metal on a surface of a magnet that is damaged and denatured by mechanical working, a magnet surface layer damaged and denatured by the mechanical working such as cutting, drilling, grinding, polishing can be repaired and the magnetic property largely restored. Furthermore, as a result, this contributes to realizing a small and high output power motor with a micro and high performance magnet.

We claim:

1. A method of manufacturing a small rare earth permanent magnet comprising the steps of:
   forming a cylindrical or disc-shaped rare earth magnet with a hole forming an inner surface, wherein the magnet has a surface to volume ratio of 2 $mm^{-1}$ or more and a volume of 100 $mm^3$ or less, the forming step including a step of applying mechanical processing to a sintered Nd—Fe—B system or Pr—Fe—B system rare earth magnet block material so as to damage the surface of the magnet and to cause a magnetic characteristic $(BH)_{max}$ of the magnet to deteriorate,
   inserting an electrode wire into the hole of the cylindrical or disc-shaped magnet,
   supporting the magnet on the electrode wire in a depressurized tank,
   placing the electrode wire between oppositely-disposed targets in the tank, wherein the oppositely-disposed targets are ring-shaped targets disposed concentrically with respect to the center axis of the cylindrical or disc-shaped magnet, the electrode wire extending and being fixed on a rotation shaft of a motor located outside of one of the ring-shaped targets,
   reverse-sputtering the magnet while the magnet is made to be electrically negative through the electrode wire,
   transforming an R metal (R denotes at least one kind of rare earth elements selected from the group consisting of Y, Nd, Dy, Pr, Ho and Tb) or an alloy containing an R metal into fine particles by a sputtering method,
   rotating the magnet with the electrode wire as a rotation shaft,
   allowing the fine particles to fly three-dimensionally and deposit to form uniform film onto the whole or part of the surface of the magnet,
   allowing the film to diffuse and permeate from the surface of the magnet to the inside of the magnet to at least a depth corresponding to a radius of a grain exposed on the outermost surface of the magnet, and thereby modifying the damaged magnet surface so that the magnetic characteristic $(BH)_{max}$ is recovered to 280 $kJ/m^3$ or more.

2. A method of manufacturing a rare earth permanent magnet as set forth in claim 1, wherein the step of allowing the fine particles to fly and deposit is carried out at the same time as the step of allowing the film to diffuse and permeate the magnet.

3. A method of manufacturing a rare earth permanent magnet as set forth in claim 1, wherein the step of allowing the film to diffuse and permeate the magnet is effected while a concentration of impurity gases from the air contained in the ambient atmosphere is reduced to 50 ppm or less.

4. A method of manufacturing a rare earth permanent magnet as set forth in claim 1, wherein the R metal is Dy or Tb.

* * * * *